United States Patent
Poprawa et al.

(10) Patent No.: US 9,999,120 B2
(45) Date of Patent: Jun. 12, 2018

(54) CIRCUIT CARRIER HAVING A CONDUCTING PATH AND AN ELECTRIC SHIELD

(71) Applicants: Florian Poprawa, München (DE); Markus Schieber, München (DE); Christina Schindler, Rohrdorf-Lauterbach (DE); Jörg Zapf, München (DE)

(72) Inventors: Florian Poprawa, München (DE); Markus Schieber, München (DE); Christina Schindler, Rohrdorf-Lauterbach (DE); Jörg Zapf, München (DE)

(73) Assignee: Siemens Aktiengesellschaft, München (DE)

(*) Notice: Subject to any disclaimer, the term of this patent is extended or adjusted under 35 U.S.C. 154(b) by 218 days.

(21) Appl. No.: 14/367,894

(22) PCT Filed: Nov. 27, 2012

(86) PCT No.: PCT/EP2012/073692
§ 371 (c)(1),
(2) Date: Jun. 20, 2014

(87) PCT Pub. No.: WO2013/092127
PCT Pub. Date: Jun. 27, 2013

(65) Prior Publication Data
US 2015/0016073 A1    Jan. 15, 2015

(30) Foreign Application Priority Data

Dec. 21, 2011 (DE) .................. 10 2011 089 415

(51) Int. Cl.
*H05K 1/00*      (2006.01)
*H05K 1/02*      (2006.01)
(Continued)

(52) U.S. Cl.
CPC .......... *H05K 1/0216* (2013.01); *H01L 24/19* (2013.01); *H05K 1/0225* (2013.01); *H05K 1/115* (2013.01);
(Continued)

(58) Field of Classification Search
CPC .. H05K 1/0216; H05K 1/0225; H05K 1/0243; H05K 1/18; H05K 1/185;
(Continued)

(56) References Cited

U.S. PATENT DOCUMENTS 4,678,699 A * 7/1987 Kritchevsky ......... B29C 51/145
                                                      174/393
6,285,559 B1 * 9/2001 Fukiharu ............... H05K 1/0243
                                                      257/E23.114
(Continued)

FOREIGN PATENT DOCUMENTS

DE      9214898 U1    12/1992
DE      29505327       8/1995
(Continued)

OTHER PUBLICATIONS

German Office Action cited in German Application No. 10 2011 089 415.2, dated Jul. 13, 2012, with English Translation., German Search Report.
(Continued)

*Primary Examiner* — Timothy Thompson
*Assistant Examiner* — Rhadames J Alonzo Miller
(74) *Attorney, Agent, or Firm* — Lempia Summerfield Katz LLC

(57) ABSTRACT

The invention relates to a circuit carrier (11), comprising a digital circuit, which contains at least two components (12, 14) that are electrically connected to each other (19, 21, 20). Additionally, an electric shield (24) is provided. According to the invention, the electric shield (24) and a conducting
(Continued)

path (21) for electrically connecting the components (12, 14) are realized by means of a single layered composite (18). In particular, the electric shield (24) and the conducting path (21) are formed by the same electrically conductive layer, wherein a hole (25) ensures complete electrical insulation of the conducting path (21) from the shield (24). The invention further relates to a method for producing such a circuit carrier.

12 Claims, 4 Drawing Sheets

(51) Int. Cl.
    *H05K 1/18*     (2006.01)
    *H05K 1/11*     (2006.01)
    *H05K 3/30*     (2006.01)
    *H05K 3/40*     (2006.01)
    *H01L 23/00*     (2006.01)
    *H05K 3/28*     (2006.01)

(52) U.S. Cl.
    CPC ............... *H05K 1/18* (2013.01); *H05K 1/185* (2013.01); *H05K 3/30* (2013.01); *H05K 3/4038* (2013.01); *H01L 2224/18* (2013.01); *H05K 1/0243* (2013.01); *H05K 3/284* (2013.01); *H05K 2201/0715* (2013.01); *H05K 2201/09336* (2013.01); *H05K 2203/1469* (2013.01); *Y10T 29/4913* (2015.01)

(58) Field of Classification Search
    CPC . H05K 2201/0715; H05K 2201/09336; H05K 3/284
    USPC ......................................................... 361/748
    See application file for complete search history.

(56) References Cited

U.S. PATENT DOCUMENTS

| | | | |
|---|---|---|---|
| 8,822,844 B1* | 9/2014 | Dimke | H05K 1/0219 174/386 |
| 2004/0145876 A1* | 7/2004 | Romahn | H05K 9/0039 361/760 |
| 2007/0057366 A1* | 3/2007 | Katsumata | H01L 23/5386 257/723 |
| 2010/0182105 A1* | 7/2010 | Hein | H01P 3/003 333/239 |
| 2011/0266041 A1* | 11/2011 | Tuominen | H01L 23/5389 174/260 |
| 2012/0000699 A1* | 1/2012 | Inoue | H01L 23/29 174/257 |
| 2013/0088841 A1* | 4/2013 | Ohshima | H01L 23/13 361/761 |

FOREIGN PATENT DOCUMENTS

| | | |
|---|---|---|
| DE | 10125746 C1 | 2/2003 |
| DE | 102006061248 B3 | 5/2008 |
| EP | 1937040 B1 | 2/2011 |
| WO | WO2010106599 A1 | 9/2010 |
| WO | WO2011125354 A1 | 10/2011 |

OTHER PUBLICATIONS

International Search Report and Written Opinion, dated Jul. 29, 2013.

* cited by examiner

CIRCUIT CARRIER HAVING A CONDUCTING PATH AND AN ELECTRIC SHIELD

This application is the National Stage of International Application No. PCT/EP2012/073692, filed Nov. 27, 2012, which claims the benefit of German Patent Application No. DE 10 2011 089 415.2, filed Dec. 21, 2011. The entire contents of these documents are hereby incorporated herein by reference.

BACKGROUND

The present embodiments relate to a circuit carrier including a digital circuit having at least two components that are electrically connected to each other via a conducting path, and a method for producing the circuit carrier.

Digital circuits are able to be realized with carriers. These circuits may be susceptible to noise radiation and also cause noise emissions. For this reason, electric shields that provide the protection of the digital circuit and the protection of the surroundings of the digital circuit are used. This may be provided for trouble-free operation of the digital circuit. Importance is attached to the problem if a radio-frequency circuit is integrated into the digital circuit, since radio-frequency circuits emit comparatively high amounts of noise radiation. The circuits may therefore be shielded. The connecting leads (e.g., conducting paths), however, are to be routed out of the shield. In such cases, unshielded sections of the conducting path that may be a source for coupling-in or emission of noise signals arise. For example, millimeter wave circuits that are operated at a high frequency of more than 30 GHz are connected by wire bonds. Because of the method used, a certain room for action is used for the wire bonding, which is why the radio-frequency components are disposed at a certain distance from the other components of the digital circuit. These distances are covered by the conducting paths, which makes effective shielding more difficult.

Shields may include electrically-conductive covers that are connected to a frame ground surface. A connection to frame ground is used for this. Open lines, kept as short as possible, are routed out of the conductive covers and are not electrically shielded in this area.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a circuit carrier and a method for production of the circuit carrier, in which a digital circuit with at least two components and electrical connections may be produced at low cost and with unshielded areas as small as possible, are provided.

The circuit carrier includes an electric shield and a free conducting path embodied in layers of a same layered structure covering the circuit carrier and the components. The layered structure may advantageously assume a wide variety of functions with the individual layers for the circuit carrier with the digital circuit. In accordance with one or more of the present embodiments, the function of the electric shield and the creation of the conducting path are also realized by layers in the layered structure. The layers that form the shield and the conducting path may be structured in a suitable manner. It is advantageous in this case that the structured layers cause a comparatively small space requirement in the layered structure. By comparison with the use of bond wires, the digital circuit may therefore be embodied on the circuit carrier in a more space-saving manner. In addition, the structure of the shield may advantageously be taken closer to the conducting path, so that the proportion of unshielded conducting paths may be advantageously reduced.

In accordance with an advantageous embodiment, the electric shield and the conducting path may be realized in a same structured layer of the layered structure, where the conducting path is completely separated from the electric shield by a hole. By providing the hole, a same structured layer may be used simultaneously to establish the shield and the conducting path. The layer is made of an electrically-conductive material, where the complete separation between conducting path and shield has the effect of these two structures being completely galvanically separated from one another. Adjacent layers of the electrically conductive layer involved may not cancel out this galvanic separation. The adjacent layers are to be configured as electrically-insulating if the adjacent layers geometrically bridge the hole. The design of the electric shield and of the conducting path in the same structured layer has the advantage that the production outlay for the layered structure is simplified. This may be provided because the required material properties of the shield and of the conducting path are comparable. In addition, the area of the components to be shielded is spaced away from the area of the contacting by the conducting path, so that the hole may be created between these two areas.

In accordance with another embodiment, the electric shield and/or the layer having the conducting path may be applied to an electrically-insulating layer, where the insulating layer has through-holes to contact surfaces of the at least two components and/or through-holes to a frame ground connection of the circuit carrier. The insulating layer advantageously simplifies the insulation of the layer having the electric shield and/or the conducting path in relation to the circuit carrier. In order to effect electrical contacting to the contact surfaces located on the circuit carrier or to the frame ground connection, the insulating layer is therefore to be penetrated by through-holes. To establish contact, these through-holes will be filled up with an electrically-conductive material. It is advantageous if the insulating layer includes a photo-structurable material. This enables areas that do not require electrical insulation between the layer having the shield and/or the conducting path and the circuit carrier to be removed by photo-chemical methods. These include the through-holes already mentioned.

In one embodiment, the layer having the electric shield and/or the conducting path may be provided with an electrically-conductive strengthening layer. In this way, a comparatively thin electrically-conductive layer may, for example, be created on the insulating layer lying therebelow, for example, by vapor deposition. This may be structured and subsequently, in a galvanic process, for example, be increased in layer thickness such that, at an end, a sufficient cross-sectional surface of the conducting path or a sufficient thickness of the electric shield is achieved. The production of the layer with strengthening layers thus has process technology advantages that have the effect of cost advantages and savings in production time.

In accordance with another embodiment, the layer having the electric shield may have cutouts in the area of the electric shield. This enables the shielding effect of the electric shield to be adapted to the respective application. The cutouts alter the electrical behavior of the electric shield so that even when using layer technology, an optimized behavior of the electric shield may be created. If there is a further strengthening layer on the layer having the electric shield (which likewise forms the electric shield), then the cutouts are also provided in the strengthening layer.

In accordance with a further embodiment, the finished circuit carrier with all layers located thereon may be provided with electrically-insulating sealing. This provides that the circuit carrier may be reliably sealed against the environment. Thus, the circuit carrier is advantageously able to be used even in a problematic environment, such as the engine compartment of a motor vehicle, for example.

One or more of the present embodiments are achieved by the method specified at the start in that the electric shield and the conducting path are produced in layers of a same layered structure covering the circuit carrier and the components. The advantages that are associated with the integration of the electric shield and the conducting path into the layered structure have already been explained above in relation to the circuit carrier. That the layered structure is to cover the components and the circuit carrier does not provide that all layers of the layered structure are located above the component or the circuit carrier. For example, first layers of the layered structure may also be applied to the circuit carrier, then a component may be placed. Further layers of the layered structure may then be applied, so that the component is enclosed by the layers of the layered structure. However, the layers touch in other areas of the circuit carrier, so that the layers of the layered structure are contiguous thereby (e.g., the adjacent layers of the layered structure touch each other at least in some areas of the layered structure).

In accordance with an embodiment of the method, the electric shield and the conducting path may be produced by structuring a hole separating the conducting path from the electric shield such that the electric shield and the conducting path lie in a same layer of the layered structure. As already explained, the layer of the layered structure involved and possibly a subsequent strengthening layer may follow. Thereafter, a structuring of these layers may be undertaken, through which the hole is created. The hole results in a galvanic separation of the conducting path from the electric shield, so that these components are electrically independent of one another.

In another embodiment of the method, before the layer having the shield and/or the conducting path is applied, an electrically-insulating layer, in which through-holes to contact surfaces of the at least two components and/or through-holes to a frame ground connection of the circuit carrier are structured, may be applied. The through-holes are subsequently filled with electrically-conducting material for contacting. In this way, the conducting path may, for example, be electrically contacted with components lying beneath the layered structure (or contact surfaces). In addition, the shield may thus be guided to a frame ground layer of the circuit carrier, which may lie on the non-equipped rear side of the circuit carrier. In this case, through-holes that allow an electrical connection with the shield on the equipping side of the circuit carrier are also to be provided in the circuit carrier. It is advantageous if the structuring is undertaken by laser ablation or by a photo structuring. These methods involve conventional methods that may be employed with high process safety. For photo structuring, the materials suitable for this purpose are to be selected. Laser ablation may also be carried out for materials that are not suitable for photo structuring.

BRIEF DESCRIPTION OF THE DRAWINGS

Elements in the drawing that are the same or correspond to one another are each labeled in the figures with the same reference characters and are only explained more than once in the event of there being differences between the individual figures.

DETAILED DESCRIPTION OF THE DRAWINGS

Figure 1:
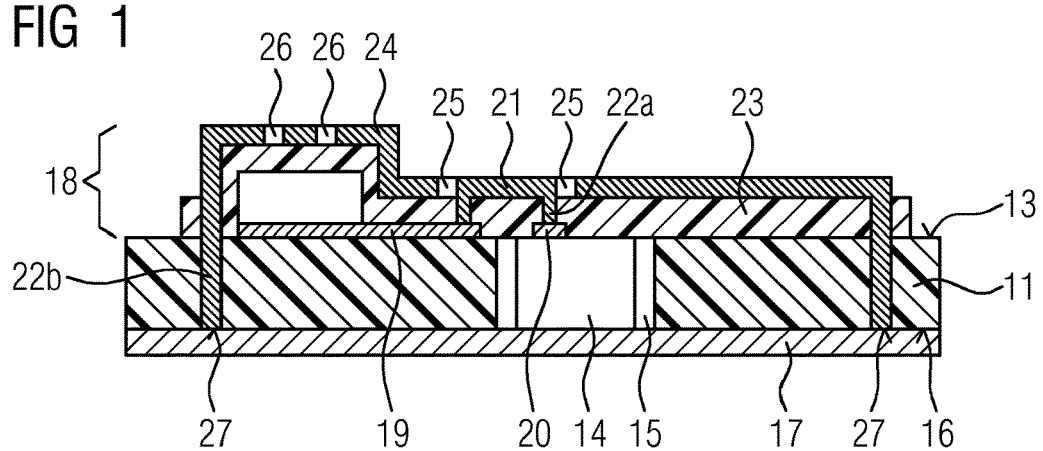
FIG. 1 shows an exemplary embodiment of a circuit carrier in cross-section.

FIG. 1 shows one embodiment of a circuit carrier 11 that is equipped with a component 12 on a mounting side 13 of the circuit carrier 11 and with a high-frequency (HF) component. The HF component 14 is installed in an opening that is larger in dimensions than the HF component 14. A rear side 16 is provided with a layer 17 that also forms the electric frame ground of the circuit carrier.

A layered structure 18 that includes a number of layers is provided on the mounting side 13 of the circuit carrier 11. Some of the layers are structured in order to implement the construction described in greater detail below. Conductor tracks 19 are printed onto the circuit carrier 11. The conductor tracks 19 are used for contacting the component 12. The HF component 14 has a contact surface 20. A conducting path 21 that is connected via through-holes 22a through an electrically insulating layer 23 with the conductor track 19 and the contact surface 20 is formed in one of the layers and thus makes electric contacting between the component 12 and the HF component 14 possible. The conducting path 21 has also been originally a part of the layer 24 for electric shielding of the component 12 and the HF component 14, however, galvanically completely separated by a hole 25 from the rest of the layer 24 (cf., FIG. 2).

On the mounting side 13 of the circuit carrier, the electric shield covers both the component 12 and the HF component 14. The shield is only penetrated in the region of the hole 25. In addition, slots may be provided by cutouts 26 in the layer 23 (e.g., above the component 12), through which the electrical behavior of the shield may be influenced. In addition, the layer 24 for electric shielding is connected via through-holes 22b to a layer 17 forming a frame ground connection 27, so the layer 17 on the rear side 16 of the circuit carrier 11 is also employed as the electric shield.

Figure 2:
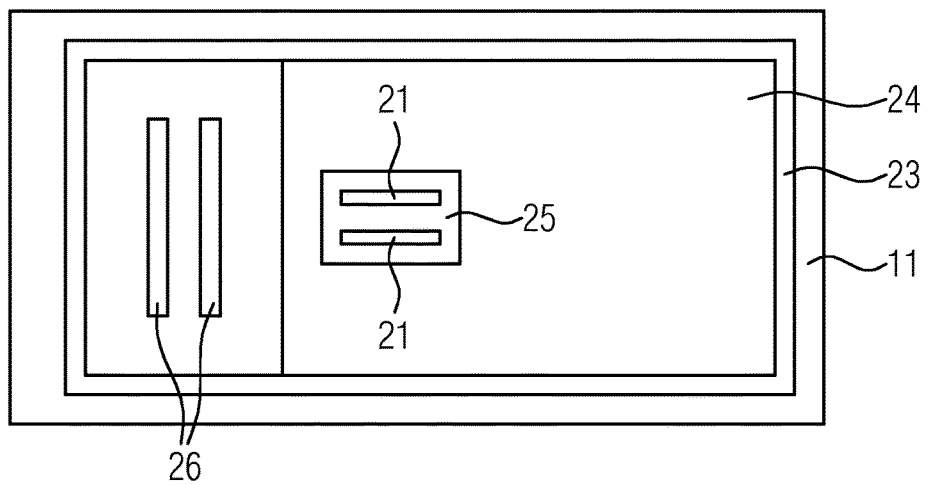
FIG. 2 shows an overhead view of the circuit carrier in accordance with FIG. 1.

In FIG. 2, the dimensions of the layer 24 that forms the electric shield and also the dimensions of the circuit carrier 11 are shown, since this figure involves an overhead view of the mounting side 13 of the circuit carrier 11. The insulating layer 23 is also shown. The hole 25 surrounds the two conducting paths 21, of which only one is shown in FIG. 1, so that there is complete galvanic separation from the rest of the layer 24. The cutouts 26, with which the electrical behavior of the shield (e.g., layer 24) is able to be influenced, are also shown.

Figure 3:
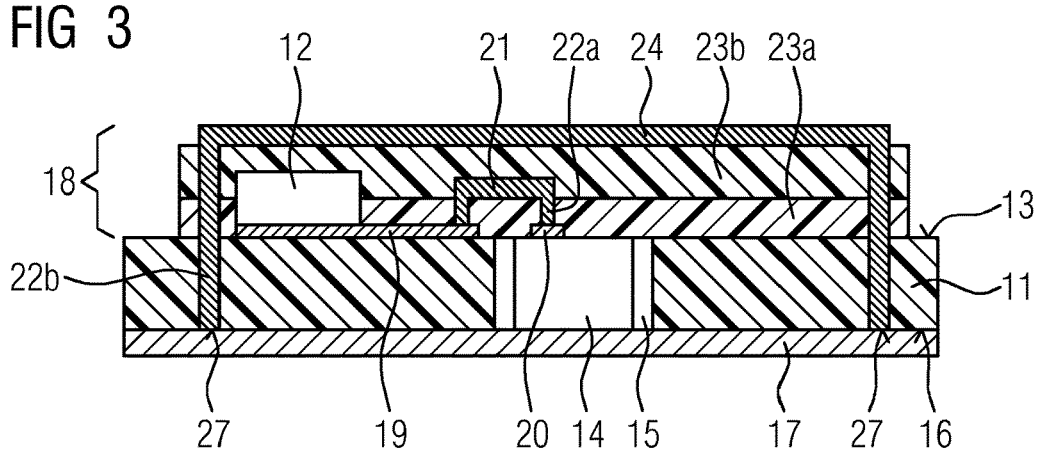
FIG. 3 shows another exemplary embodiment of the circuit carrier in cross-section.

Another embodiment of the layered structure 18 is shown in FIG. 3. In all other respects, the circuit carrier 11 with the mounted component 12 and the HF component 14 corresponds to FIG. 1. However, the conducting path 21 is not separated from the layer 24 representing the electric shield by a hole, but by being produced in different layers. Otherwise, nothing more is shown in FIG. 3 of the one layer of which the conducting path 21 is a part. This layer was produced and structured on the insulating layer 23a. The layer 24 for electric shielding is produced on a second insulating layer 23b that is therefore located between the conducting path 21 and the layer 24 for electric shielding. In this way, the galvanic separation is provided. Both the two insulating layers 23a, 23b and the circuit carrier 11 have the through-holes 22b in order to connect the layer 24 to the layer 17 forming the electric frame ground.

Figure 4:
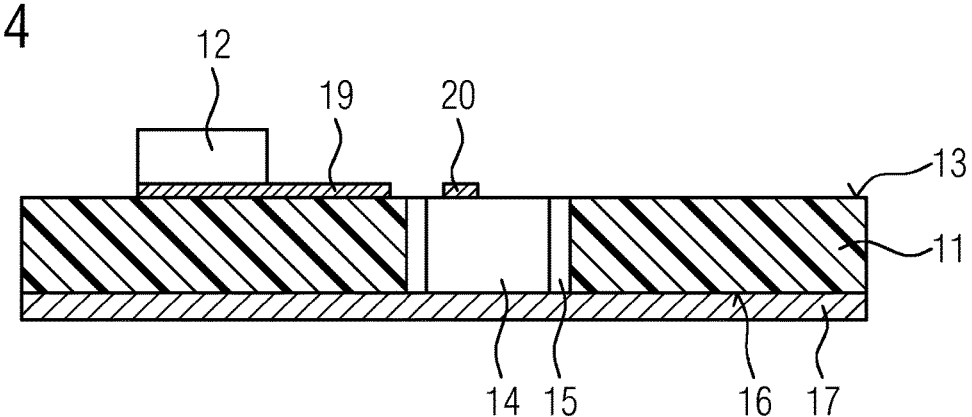
FIGS. 4-7 show selected acts of an exemplary embodiment of a method for producing a circuit carrier similar to that depicted in FIG. 1.

Production acts for manufacturing a circuit carrier in accordance with FIG. 1 may be taken from FIG. 4. In one act, the conductor track 19 is created on the circuit carrier 11. For example, a structuring of a metal layer (not shown in any greater detail in FIG. 4) may be carried out in photochemical ways in a manner known. In addition, an insertion opening 15 is made in the circuit carrier 11. On a rear side 16 of the circuit carrier 11, the layer 17, which is to serve as the electrical frame ground connection, is applied. As an alternative, a circuit carrier 11, in which the layer 17 is already produced as a prefabricated item, may also be used. The equipping of the circuit carrier takes place. The component 12 is placed on the mounting side 13 of the circuit carrier 11 and is connected to the conductor track 19. In addition, the HF component 14 is inserted into the installation opening 15.

Figure 5:
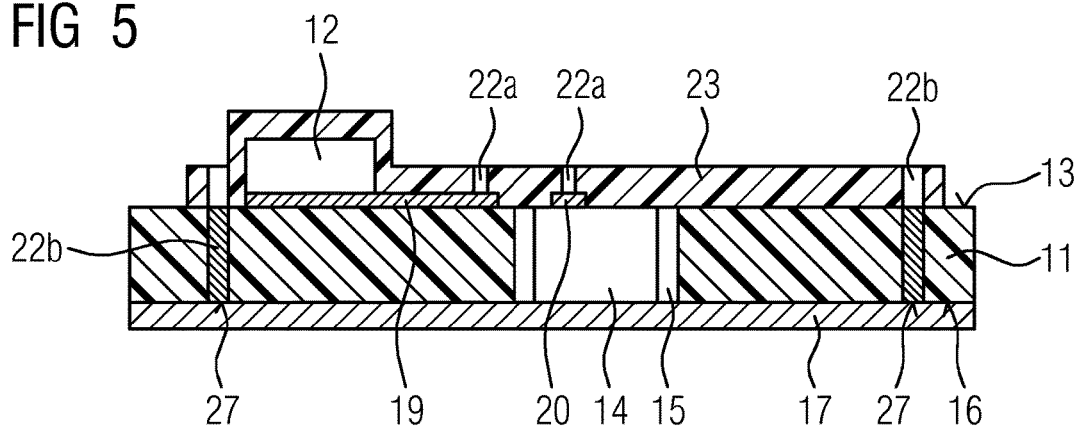

FIG. 5 shows how a lacquer able to withstand high frequencies (e.g., epoxy) is applied as an electrically-insulating coating 23 to the mounting side 13 of the circuit carrier 11.

As an alternative, an insulation film (e.g., a Teflon film) may also be laminated on. The material may be photosensitive in order to subsequently be able to be structured with optical methods. As an alternative, a structuring by laser ablation, for example, may also be provided. The thickness of the coating 23 may amount to between 10 and 500 µm.

In order to obtain access to the conductor track 19 and also to the contact surface 20 located on the HF component 14, the structuring of the layer 23 includes making through-openings 22a. In precisely the same way, through-openings 22b that are to be understood as extensions of the through-openings 22b inserted in the circuit carrier 11 are inserted. These through-openings 22b provide the possibility of creating an electrical connection to the layer 17 serving as the electric frame ground. Therefore, the through-openings 22b are also filled up at least in the area of the circuit carrier with an electrically conductive material (as indicated).

Figure 6:
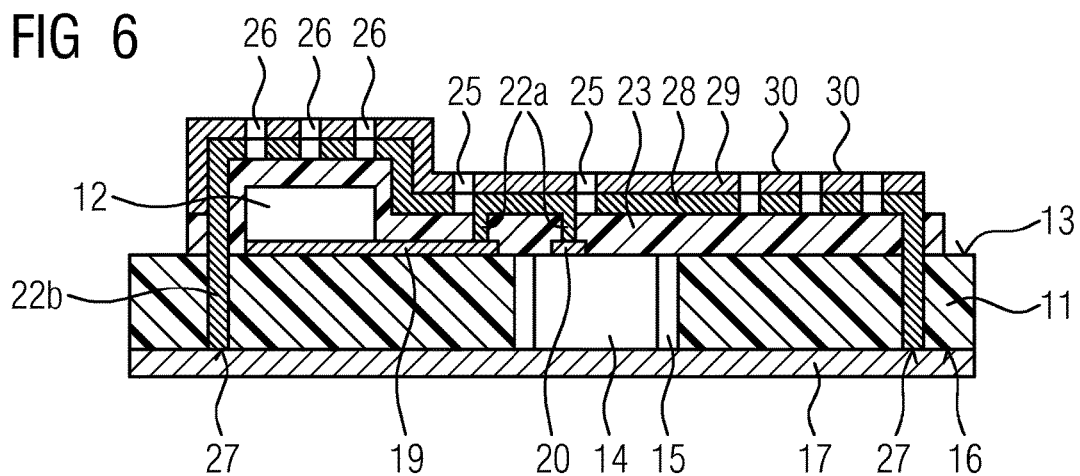

FIG. 6 shows how initially a layer is supplied for electric shield 28 using gas phase deposition (e.g., sputtering or vapor deposition). The material of the layer 28 also penetrates into the through-holes 22a, 22b so that electric bridging of the electrically-insulating layer 23 is made possible. As an alternative, a copper-clad foil may also be laminated on. The thickness of the layer 28 amounts to between 100 nanometers and 5 µm. This layer 28 is used for depositing a strengthening layer 29 in an electrochemical way. This simplifies the production of electric shields with sufficient thickness. For example, copper may be deposited non-electrically in an electrochemical way onto the layer 28. The metal coating including the layers 28 and 29 may be embodied between 10 and 50 µm thick. Not shown is the possibility of a further corrosion protection layer on the strengthening layer 29, which may, for example, include tin with a thickness of between 1 and 5 µm. The layers 28, 29 are structured by laser ablation, for example. The cutouts 26 and also the hole 25 are inserted. In addition, contact surfaces 30 that are intended to be equipped with further components are produced by a further structuring.

Figure 7:
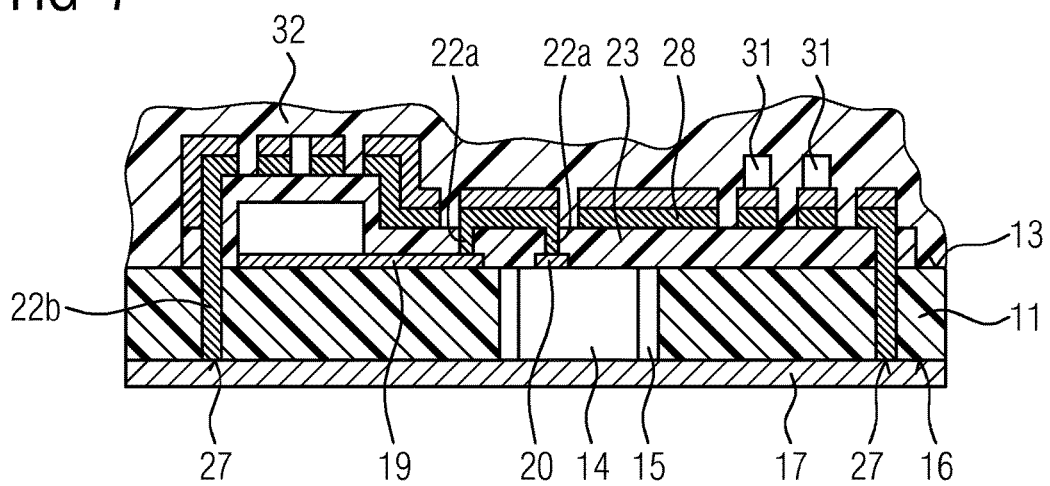

In FIG. 7, the equipping with further components 31 is shown. In addition, the complete assembly produced has been covered by an electrically-insulating protective lacquer 32, so that the circuit is sealed.

Figure 8:
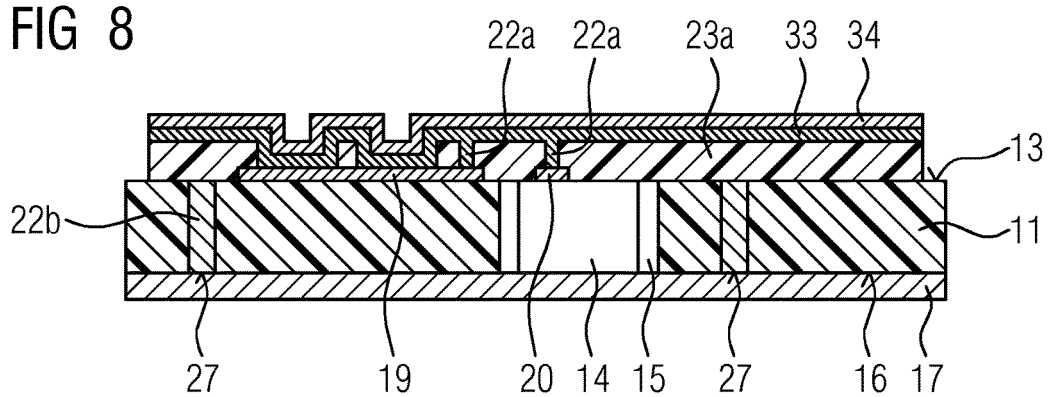
FIGS. 8-11 show selected acts of another exemplary embodiment for producing a circuit carrier similar to that depicted in FIG. 3.

FIG. 8 shows selected method acts for producing a structure in accordance with FIG. 3. As described for FIGS. 4 and 5, a circuit carrier 11 with a coating 17 on the rear side 16 and filled through-holes 22b is available in the circuit carrier. The circuit carrier is provided with the conductor track 19 and has an HF component 14. Unlike in the previous method, however, before the circuit carrier is equipped with components 12, a first electrically-insulating layer 22a is applied. The first electrically-insulating layer 22a is resistant to radio-frequencies (e.g., epoxy) and may be applied in the manner described. This is structured such that the mounting locations on the conductor track 19 are available for the components 12, and the through-holes 22a are produced. Subsequently, in the manner as is described for FIG. 6 for producing the layers 28 and 29, a layer 33 for the conducting path and strengthening layer 34 lying thereon are created.

Figure 9:
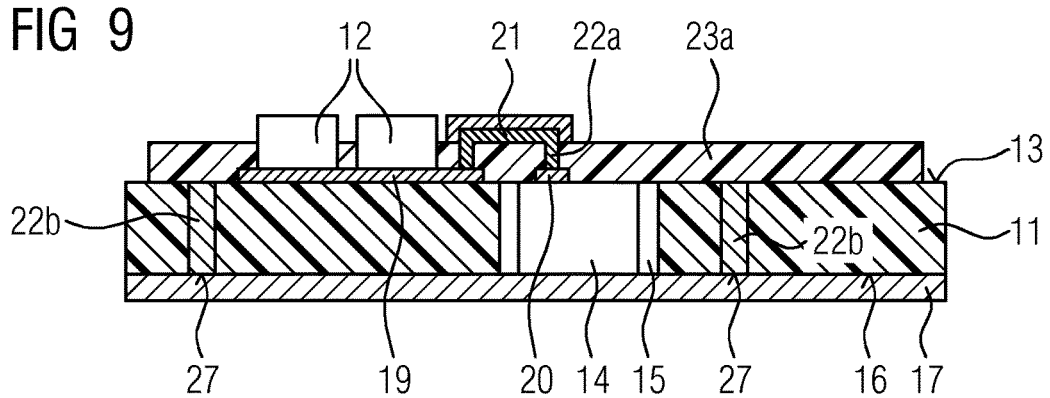

As shown in FIG. 9, through structuring of layers 33 and 34 (cf., FIG. 8), the conducting path 21 is produced. By producing the layer 33, the through-holes 22a are also filled. By structuring the layers 33, 34, the mounting locations for the components 12 are again uncovered, which are likewise equipped with components.

Figure 10:
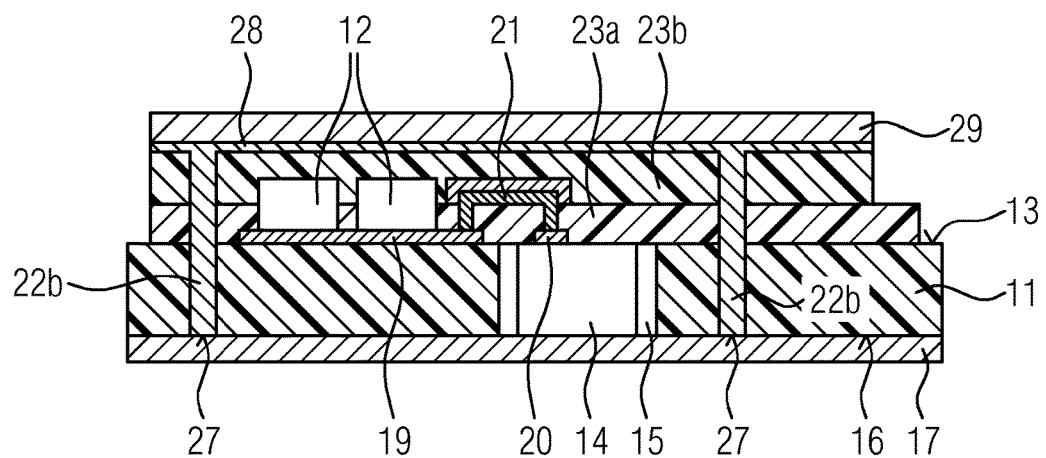

FIG. 10 reveals that the components 12 and the conducting path 21 may be covered completely by applying an electrically-insulating layer 23b. The layer 23b is applied and likewise structured as per the method step according to FIG. 5. In this act, the through-holes 22b in the layers 23a, 23b are produced, and thus, a connection is made to the through-hole 22b located in the circuit carrier. Subsequently, the layer 28 for the electric shield is supplied to the electrically-insulating layer 23b, where the method described for FIG. 6 is used. In this case, the through-holes 22b are also filled up with conductive material. The application of the strengthening layer 29 is also already described in FIG. 6.

Figure 11:
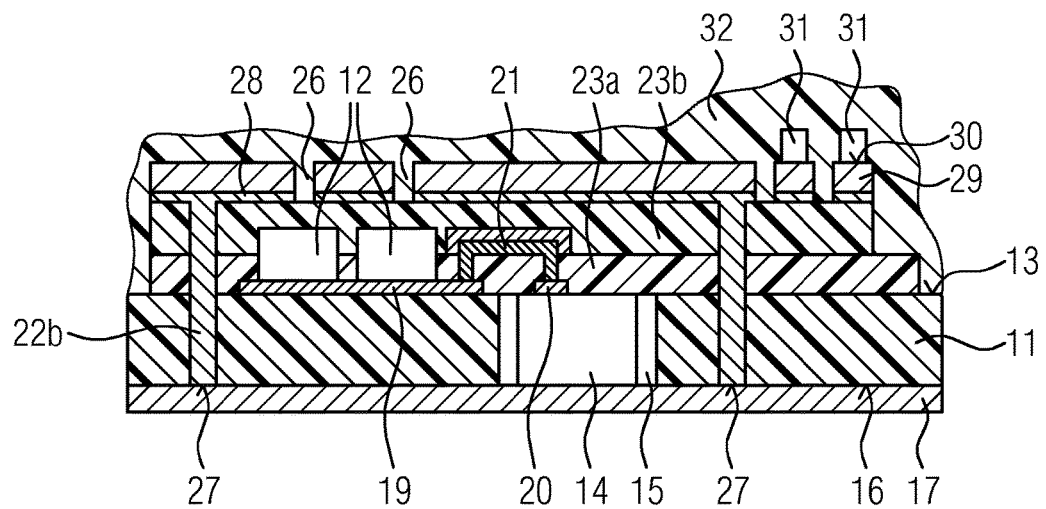

FIG. 11 shows that the layers 28, 29 may be structured (e.g., in a similar way to that described for FIG. 6). Here, the cutouts 26 and additional contact surfaces 30, which may be equipped with additional components 31, are produced. The protective layer 32 is subsequently applied to the mounting side 13 of the circuit carrier 11 as a seal.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A circuit carrier comprising:
a digital circuit, in which at least two components are electrically connected via a conducting path; and
an electric shield that spans at least one component of the at least two components,
wherein the electric shield and the conducting path are configured in layers of a layered structure of the circuit carrier, and the layers cover the at least two components,
wherein a layer of the layered structure having the electric shield, the conducting path, or the electric shield and the conducting path is disposed on an electrically-insulating layer,
wherein a first component of the at least two components is supported by a first side of the electrically-insulating layer and a second component of the at least two components is supported by a ground layer that abuts a second side of the electrically-insulating layer,
wherein the electric shield and the conducting path are realized in and from a same conducting structured layer of the layered structure, and
wherein the conducting path is completely separated from the electric shield by a hole.

2. The circuit carrier of claim 1, wherein the electrically-insulating layer has through-holes to contact surfaces of the at least two components, through-holes to a frame ground connection of the circuit carrier, or the through-holes to the contact surfaces of the at least two components and the through-holes to the frame ground connection of the circuit carrier.

3. The circuit carrier of claim 2, wherein the electrically-insulating layer includes a photostructured material.

4. The circuit carrier of claim 1, wherein the structured layer having the electric shield has cutouts in an area of the electric shield.

5. The circuit carrier of claim 1, wherein a layer having the electric shield, the conducting path, or the electric shield and the conducting path is provided with an electrically-conducting strengthening layer.

6. The circuit carrier of claim 5, wherein the layer having the electric shield and the strengthening layer have cutouts in an area of the electric shield.

7. The circuit carrier of claim 1, wherein the circuit carrier, with all layers located thereon, is provided with an electrically-insulated seal.

8. The circuit carrier of claim 3, wherein the structured layer having the electric shield has cutouts in an area of the electric shield.

9. The circuit carrier of claim 3, wherein a layer having the electric shield, the conducting path, or the electric shield and the conducting path is provided with an electrically-conducting strengthening layer.

10. The circuit carrier of claim 9, wherein the layer having the electric shield and the strengthening layer have cutouts in an area of the electric shield.

11. The circuit carrier of claim 3, wherein the circuit carrier, with all layers located thereon, is provided with an electrically-insulated seal.

12. The circuit carrier of claim 1, wherein the circuit carrier, with all layers located thereon, is provided with an electrically-insulated seal.

* * * * *